(12) United States Patent
Xie

(10) Patent No.: US 11,301,069 B2
(45) Date of Patent: Apr. 12, 2022

(54) TOUCH DISPLAY PANEL AND MANUFACTURING METHOD THEREOF, AND TOUCH DISPLAY DEVICE

(71) Applicant: Wuhan China Star Optoelectronics Semiconductor Display Technology Co., Ltd., Wuhan (CN)

(72) Inventor: Ming Xie, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 200 days.

(21) Appl. No.: 16/638,141

(22) PCT Filed: Jan. 13, 2020

(86) PCT No.: PCT/CN2020/071653
§ 371 (c)(1),
(2) Date: Feb. 11, 2020

(87) PCT Pub. No.: WO2021/036177
PCT Pub. Date: Mar. 4, 2021

(65) Prior Publication Data
US 2021/0397278 A1    Dec. 23, 2021

(30) Foreign Application Priority Data
Aug. 29, 2019    (CN) .......................... 201910810193.X

(51) Int. Cl.
*G06F 3/041*    (2006.01)
*H01L 27/32*    (2006.01)
(Continued)

(52) U.S. Cl.
CPC .......... *G06F 3/0412* (2013.01); *H01L 27/323* (2013.01); *H01L 27/3246* (2013.01); *H01L 51/5253* (2013.01); *H01L 51/5281* (2013.01); *H01L 51/56* (2013.01); *G06F 2203/04103* (2013.01); *H01L 2227/323* (2013.01); *H01L 2251/558* (2013.01)

(58) Field of Classification Search
CPC ............... H01L 27/323; H01L 27/3246; H01L 51/5253; H01L 51/5281; H01L 51/56; G06F 3/0412; G06F 3/0445; G06F 3/044
See application file for complete search history.

(56) References Cited

U.S. PATENT DOCUMENTS 10,430,000 B2 * 10/2019 Wu .................. G06F 3/0412
10,620,731 B2 *  4/2020 Lee ................. G06F 3/0448
(Continued)

FOREIGN PATENT DOCUMENTS

CN    106158909    11/2016
CN    107272958    10/2017
(Continued)

*Primary Examiner* — Sardis F Azongha

(57) ABSTRACT

The present invention provides a touch display panel and a manufacturing method thereof, and a touch display device. The touch display panel includes a substrate layer, a light emitting layer, a thin film encapsulation layer, a polarizer, and a cover plate which are arranged in sequence. The light emitting layer includes a planarization layer, a first pixel definition layer, and a first touch electrode layer which are arranged in sequence.

18 Claims, 6 Drawing Sheets

(51) Int. Cl.
 *H01L 51/52* (2006.01)
 *H01L 51/56* (2006.01)

(56) References Cited

U.S. PATENT DOCUMENTS

| | | | |
|---|---|---|---|
| 11,217,637 B2 * | 1/2022 | Yang | .................. H01L 27/3246 |
| 2016/0322429 A1 | 11/2016 | Chen et al. | |
| 2019/0012022 A1 | 1/2019 | Ye | |
| 2020/0057520 A1 * | 2/2020 | Hung | .................. H01L 27/3272 |
| 2020/0201483 A1 | 6/2020 | Feng | |
| 2021/0327965 A1 * | 10/2021 | He | ......................... H01L 51/56 |

FOREIGN PATENT DOCUMENTS

| | | |
|---|---|---|
| CN | 107291295 | 10/2017 |
| CN | 109407893 | 3/2019 |

\* cited by examiner

TOUCH DISPLAY PANEL AND MANUFACTURING METHOD THEREOF, AND TOUCH DISPLAY DEVICE

RELATED APPLICATIONS

This application is a National Phase of PCT Patent Application No. PCT/CN2020/071653 having International filing date of Jan. 13, 2020, which claims the benefit of priority of Chinese Patent Application No. 201910810193.X filed on Aug. 29, 2019. The contents of the above applications are all incorporated by reference as if fully set forth herein in their entirety.

FIELD AND BACKGROUND OF THE INVENTION

The present invention relates to the technical field of display panels, and in particular, to a touch display panel and a manufacturing method thereof, and a touch display device.

With developments of touch technologies and display technologies, touch display devices have been more and more popular. They not only can save space and be portable, but can also be directly operated and used by users with their fingers or stylus, which is comfortable to use and very convenient. At present, they have been widely used in various technical fields, such as personal digital assistants (PDAs), touch phones, portable notebooks, etc.

Active matrix organic light emitting displays (AMO-LEDs) are emerging flat panel displays. Because they have advantages such as active light emission, high contrast, fast response, thinness, etc., they are known as next-generation displays that can replace LCD displays. At present, combinations of the touch technologies and AMOLED display technologies have attracted much attention. It is foreseeable that touch AMOLED displays will become mainstreams of the market. Flexible touch AMOLED displays have advantages of being curled and folded to wear.

In the prior art, touch circuits in touch display panels are disposed on thin film encapsulation layers, which cause a thickness of an entire display panel to be thick and have poor bending resistance, and product yields are low.

Therefore, it is necessary to develop a new type of touch display panels to overcome defects of current technologies.

An object of the present invention is to provide a touch display panel, which can solve the problem that thicknesses of display panels in the prior art are thicker.

To achieve the above object, the present invention provides a touch display panel comprising a substrate layer, a light emitting layer, a thin film encapsulation layer, a polarizer, and a cover plate which are arranged in sequence; wherein the light emitting layer comprises a planarization layer, a first pixel definition layer, and a first touch electrode layer which are arranged in sequence.

Further, in other embodiments, wherein the light emitting layer further comprises a second pixel definition layer and a second touch electrode layer which are arranged in sequence, the second pixel definition layer is disposed on the first touch electrode layer, the second touch electrode layer is disposed on the second pixel definition layer, and the first touch electrode layer and the second touch electrode layer are not in contact with each other to form an embedded touch circuit.

Further, in other embodiments, wherein the light emitting layer further comprises a third pixel definition layer, and the third pixel definition layer is disposed between the second touch electrode layer and the thin film encapsulation layer.

Further, in other embodiments, wherein a material used for the first pixel definition layer comprises polyimide.

Further, in other embodiments, wherein the first touch electrode layer is in a rhombic grid shape.

Further, in other embodiments, wherein the first touch electrode layer is made of a material selected from titanium-aluminum alloy or silver nanowires.

Further, in other embodiments, wherein a thickness of the first pixel definition layer ranges from 0.4 um to 0.6 um.

Further, in other embodiments, wherein a thickness of the first touch electrode layer ranges from 0.6 um to 0.8 um.

To achieve the above object, the present invention further provides a manufacturing method of the display panel according to the present invention, comprising following steps of:

S1: providing a substrate layer, wherein a planarization layer is formed on the substrate layer;

S2: depositing a first pixel definition layer on the planarization layer;

S3: depositing a first touch electrode layer on the first pixel definition layer;

S4: depositing a second pixel definition layer on the first touch electrode layer;

S5: depositing a second touch electrode layer on the second pixel definition layer, wherein the first touch electrode layer and the second touch electrode layer are not in contact with each other to form an embedded touch circuit;

S6: depositing a third pixel definition layer on the second touch electrode layer to form a light emitting layer; and S7: forming a thin film encapsulation layer, a polarizer, and a cover plate in sequence.

To achieve the above object, the present invention further provides a touch display device, which comprises a body, and the body is provided with the touch display panel according to the present invention.

Compared with the prior art, beneficial effects of the present invention are: The present invention provides a touch display panel and a manufacturing method thereof, and a touch display device. There is no need to separately dispose a touch circuit on a thin film encapsulation layer, only the touch circuits need to be disposed in a pixel definition layer to reduce a thickness of the display panel. The process is simple, which reducing operating procedures and saving process costs, and enhances product's resistance to bending, resulting in light and high-strength flexible devices. It can be used in industrial production and can optimize the design of folding screen.

BRIEF DESCRIPTION OF THE SEVERAL VIEWS OF THE DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DESCRIPTION OF SPECIFIC EMBODIMENTS OF THE INVENTION

The technical solutions in the embodiments of the present invention will be clearly and completely described with reference to the accompanying drawings in the embodiments of the present invention. Obviously, the described embodiments are only a part of the embodiments of the present invention, but not all the embodiments. Based on the embodiments of the present invention, all other embodiments obtained by a person of ordinary skill in the art without creative efforts shall fall within the protection scope of the present invention.

The specific structural and functional details disclosed herein are merely representative and are used for the purpose of describing exemplary embodiments of the present invention. The invention may, however, be embodied in many alternative forms and should not be construed as limited to the embodiments set forth herein.

Embodiment 1

Figure 1:
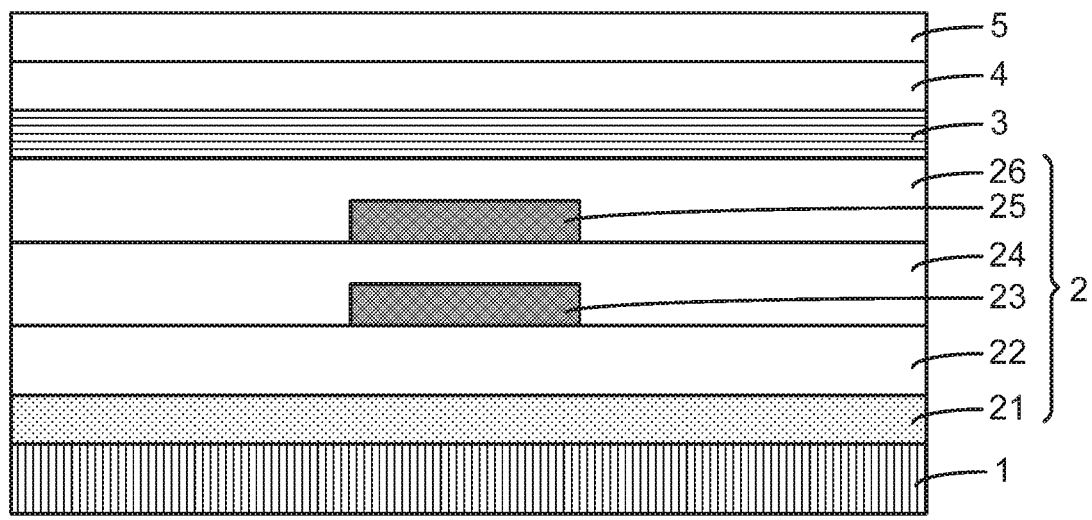
FIG. 1 is a schematic view of a touch display panel according to Embodiment 1 of the present invention.

The embodiment provides a touch display panel. Please refer to FIG. 1. FIG. 1 is a schematic structural view of a touch display panel provided by the embodiment. The touch display panel comprises a substrate layer 1, a light emitting layer disposed on the substrate layer 1, a thin film encapsulation layer 3 disposed on the light emitting layer 2, a polarizer 4 disposed on the thin film encapsulation layer 3, and a cover plate 5 disposed on the polarizer 4.

The light emitting layer 2 comprises a planarization layer 21, a first pixel definition layer 22 disposed on the planarization layer 21, a first touch electrode layer 23 disposed on the first pixel definition layer 22, a second pixel definition layer 24 disposed on the first touch electrode layer 23, a second touch electrode layer 25 disposed on the second pixel definition layer 24, and a third pixel definition layer 26 disposed on the second touch electrode layer 25.

The first touch electrode layer 23 and the second touch electrode layer 25 are in a rhombic grid shape.

The first touch electrode layer 23 and the second touch electrode layer 25 are not in contact with each other to form an embedded touch circuit. When the first touch electrode layer 23 is energized, the second touch electrode layer 25 is not energized, and an electrode is formed between the first touch electrode layer 23 and the second touch electrode layer 25 and remains constant. When a finger touches a display device, two capacitors form a difference, and a signal is transmitted to a chip to form an image.

In the embodiment, thicknesses of the first pixel definition layer 22, the second pixel definition layer 24, and the third pixel definition layer 26 range from 0.4 um to 0.6 um. Thicknesses of the first touch electrode layer 23 and the second touch electrode layer 25 range from 0.6 um to 0.8 um.

A material used for the first pixel definition layer 22, the second pixel definition layer 24, and the third pixel definition layer 26 is polyimide.

The first touch electrode layer 23 and the second touch electrode layer 25 are made of a material selected from titanium, aluminum, or silver-sodium rice noodles.

In the embodiment, the touch circuit does not need to be separately disposed on the thin film encapsulation layer, and only the touch circuit needs to be disposed in the pixel definition layer, which can reduce a thickness of the display panel.

Figure 2:
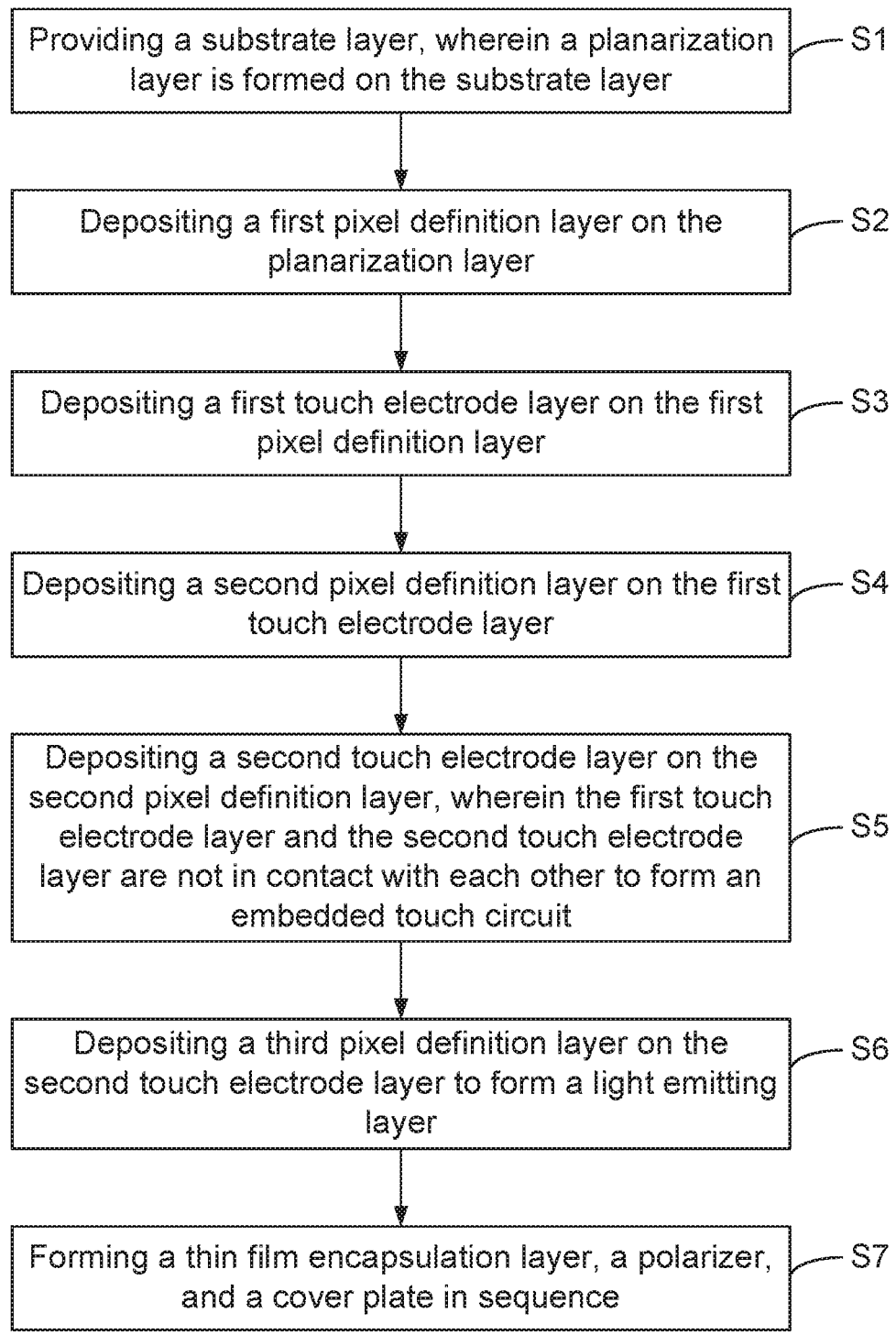
FIG. 2 is a flowchart of a manufacturing method of the touch display panel according to Embodiment 1 of the present invention.

The embodiment further provides a manufacturing method of the touch display panel according to the embodiment. Please refer to FIG. 2. FIG. 2 shows a flowchart of the manufacturing method of the touch display panel provided by the embodiment, comprising following steps of:

Step S1: providing a substrate layer 1, wherein a planarization layer 21 is formed on the substrate layer 1.

Figure 3:
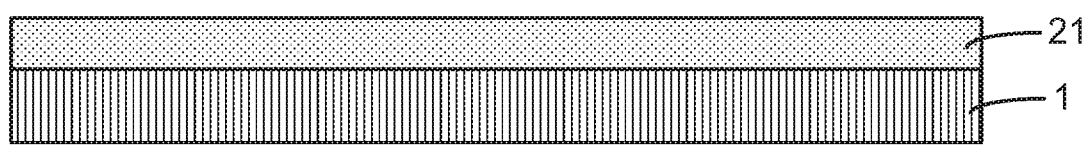
FIG. 3 is a schematic structural view of the touch display panel in step S1 in the manufacturing method provided in Embodiment 1 of the present invention.

Please refer to FIG. 3, which is a schematic structural view of the touch display panel in step S1 in the manufacturing method provided by the embodiment.

Step S2: depositing a first pixel definition layer 22 on the planarization layer 21.

Figure 4:
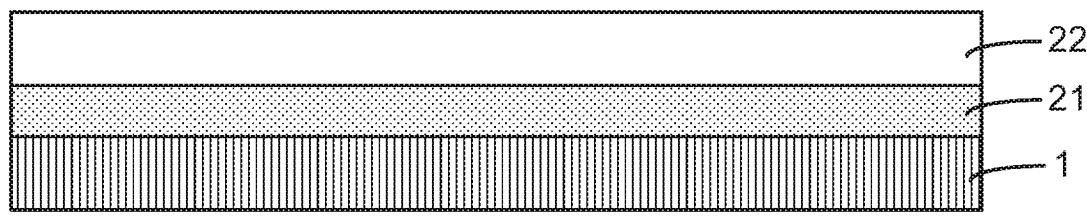
FIG. 4 is a schematic structural view of the touch display panel in step S2 in the manufacturing method provided in Embodiment 1 of the present invention.

Please refer to FIG. 4, which is a schematic structural view of the touch display panel in step S2 in the manufacturing method provided by the embodiment.

The material used for the first pixel definition layer 22 is polyimide, and the thickness of the first pixel definition layer 22 ranges from 0.4 um to 0.6 um.

Step S3: depositing a first touch electrode layer 23 on the first pixel definition layer 22.

Figure 5:
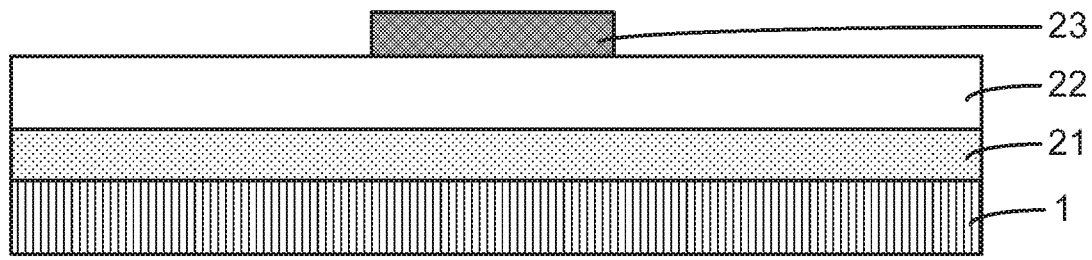
FIG. 5 is a schematic structural view of the touch display panel in step S3 in the manufacturing method provided in Embodiment 1 of the present invention.

Please refer to FIG. 5, which is a schematic structural view of the touch display panel in step S3 in the manufacturing method provided by the embodiment.

The first touch electrode layer 23 is made of a material selected from titanium, aluminum, or silver-sodium rice noodles, and the thickness of the first touch electrode layer 23 ranges from 0.6 um to 0.8 um.

Step S4: depositing a second pixel definition layer 24 on the first touch electrode layer 23.

Figure 6:
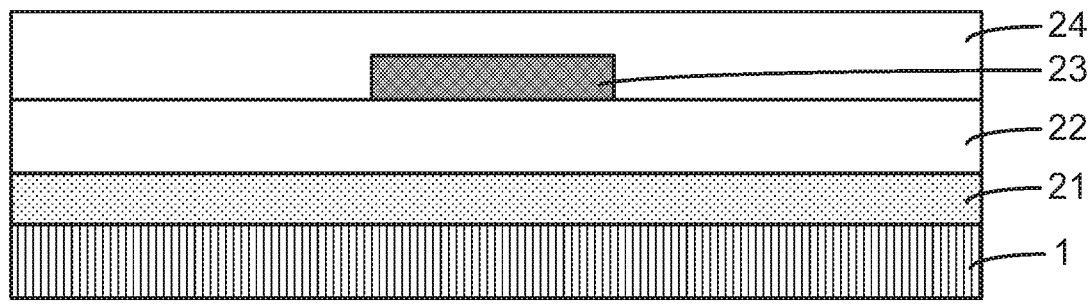
FIG. 6 is a schematic structural view of the touch display panel in step S4 in the manufacturing method provided in Embodiment 1 of the present invention.

Please refer to FIG. 6, which is a schematic structural view of the touch display panel in step S4 in the manufacturing method provided by the embodiment.

The material used for the second pixel definition layer 24 is polyimide, and the thickness of the second pixel definition layer 24 ranges from 0.4 um to 0.6 um.

Step S5: depositing a second touch electrode layer 25 on the second pixel definition layer 24, wherein the first touch electrode layer 23 and the second touch electrode layer 25 are not in contact with each other to form an embedded touch circuit.

Figure 7:
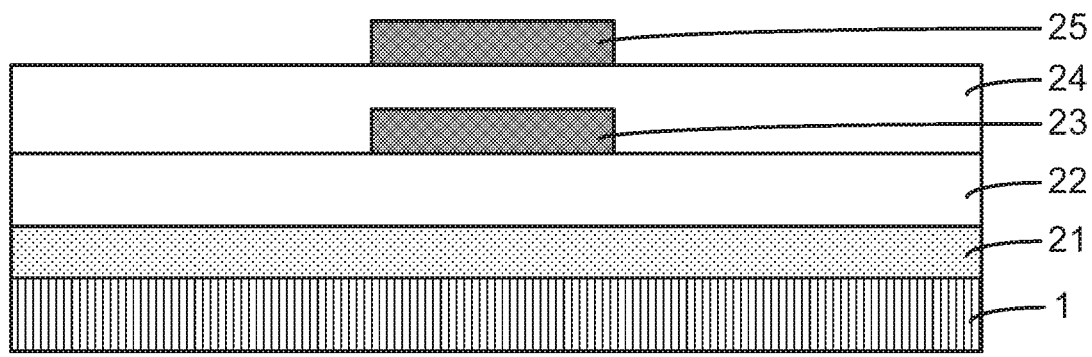
FIG. 7 is a schematic structural view of the touch display panel in step S5 in the manufacturing method provided in Embodiment 1 of the present invention.

Please refer to FIG. 7, which is a schematic structural view of the touch display panel in step S5 in the manufacturing method provided by the embodiment.

The second touch electrode layer 25 is made of a material selected from titanium, aluminum, or silver-sodium rice noodles, and the thickness of the second touch electrode layer 25 ranges from 0.6 um to 0.8 um.

When the first touch electrode layer 23 is energized, the second touch electrode layer 25 is not energized, and the electrode is formed between the first touch electrode layer 23 and the second touch electrode layer 25 and remains constant. When the finger touches the display device, the two capacitors form the difference, and the signal is transmitted to the chip to form the image.

Step S6: depositing a third pixel definition layer 26 on the second touch electrode layer 25 to form a light emitting layer 2.

Figure 8:
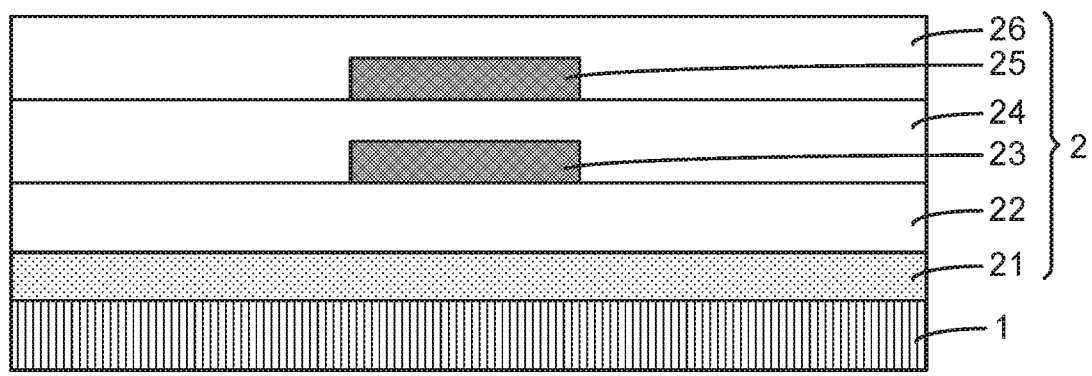
FIG. 8 is a schematic structural view of the touch display panel in step S6 in the manufacturing method provided in Embodiment 1 of the present invention.

Please refer to FIG. 8, which is a schematic structural view of the touch display panel in step S6 in the manufacturing method provided by the embodiment.

The material used for the third pixel definition layer 26 is polyimide, and the thickness of the third pixel definition layer 26 ranges from 0.4 um to 0.6 um.

Step S7: forming a thin film encapsulation layer 3, a polarizer 4, and a cover plate 5 in sequence.

Figure 9:
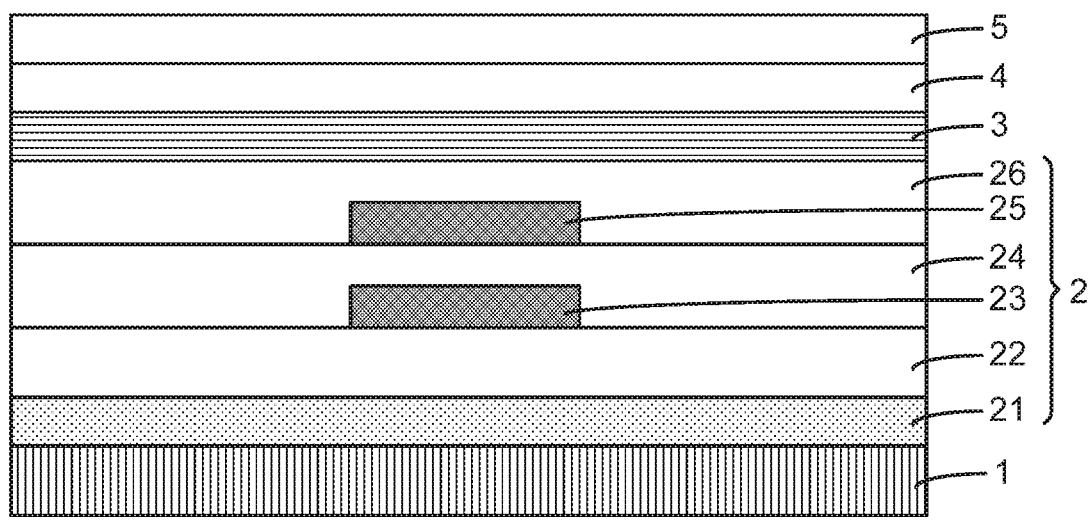
FIG. 9 is a schematic structural view of the touch display panel in step S7 in the manufacturing method provided in Embodiment 1 of the present invention.

Please refer to FIG. 9, which is a schematic structural view of the touch display panel in step S7 in the manufacturing method provided by the embodiment.

In the embodiment, there is no need to separately dispose the touch circuit on the thin film encapsulation layer, only the touch circuit needs to be disposed in the pixel definition layer to reduce the thickness of the display panel. The process is simple, which reducing operating procedures and saving process costs, and enhances product's resistance to bending, resulting in light and high-strength flexible devices. It can be used in industrial production and can optimize the design of folding screen.

The embodiment further provides a touch display device, which comprises a body, and the body is provided with the touch display panel according to the embodiment.

The beneficial effects of the invention are: The present invention provides the touch display panel and the manufacturing method thereof, and the touch display device. There is no need to separately dispose the touch circuit on the thin film encapsulation layer, only the touch circuit needs to be disposed in the pixel definition layer to reduce the thickness of the display panel. The process is simple, which reducing the operating procedures and saving the process costs, and enhances the product's resistance to bending, resulting in light and high-strength flexible devices. It can be used in the industrial production and can optimize the design of the folding screen.

The above are only preferred embodiments of the present invention. It should be noted that for those of ordinary skill in the art, without departing from the principles of the present invention, several improvements and retouches can be made, and these improvements and retouches should also be regarded as the protection scope of the present invention.

What is claimed is:

1. A touch display panel, comprising:
   a substrate layer, a light emitting layer, a thin film encapsulation layer, a polarizer, and a cover plate which are arranged in sequence;
   wherein the light emitting layer comprises a planarization layer, a first pixel definition layer, and a first touch electrode layer which are arranged in sequence; and
   a thickness of the first pixel definition layer ranges from 0.4 um to 0.6 um.

2. The touch display panel as claimed in claim 1, wherein the light emitting layer further comprises a second pixel definition layer and a second touch electrode layer which are arranged in sequence, the second pixel definition layer is disposed on the first touch electrode layer, the second touch electrode layer is disposed on the second pixel definition layer, and the first touch electrode layer and the second touch electrode layer are not in contact with each other to form an embedded touch circuit.

3. The touch display panel as claimed in claim 1, wherein the light emitting layer further comprises a third pixel definition layer, and the third pixel definition layer is disposed between the second touch electrode layer and the thin film encapsulation layer.

4. The touch display panel as claimed in claim 1, wherein the first touch electrode layer is in a rhombic grid shape.

5. The touch display panel as claimed in claim 1, wherein a material used for the first pixel definition layer comprises polyimide.

6. The touch display panel as claimed in claim 1, wherein the first touch electrode layer is made of a material selected from titanium-aluminum alloy or silver nanowires.

7. The touch display panel as claimed in claim 1, wherein a thickness of the first touch electrode layer ranges from 0.2 um to 0.4 um.

8. A manufacturing method of a touch display panel as claimed in claim 1, comprising following steps of:
   S1: providing a substrate layer, wherein a planarization layer is formed on the substrate layer;
   S2: depositing a first pixel definition layer on the planarization layer;
   S3: depositing a first touch electrode layer on the first pixel definition layer;
   S4: depositing a second pixel definition layer on the first touch electrode layer;
   S5: depositing a second touch electrode layer on the second pixel definition layer, wherein the first touch electrode layer and the second touch electrode layer are not in contact with each other to form an embedded touch circuit;
   S6: depositing a third pixel definition layer on the second touch electrode layer to form a light emitting layer; and
   S7: forming a thin film encapsulation layer, a polarizer, and a cover plate in sequence.

9. The manufacturing method as claimed in claim 8, wherein the light emitting layer further comprises the second pixel definition layer and the second touch electrode layer which are arranged in sequence, the second pixel definition layer is disposed on the first touch electrode layer, the second touch electrode layer is disposed on the second pixel definition layer, and the first touch electrode layer and the second touch electrode layer are not in contact with each other to form the embedded touch circuit.

10. The manufacturing method as claimed in claim 8, wherein the light emitting layer further comprises a third pixel definition layer, and the third pixel definition layer is disposed between the second touch electrode layer and the thin film encapsulation layer.

11. The manufacturing method as claimed in claim 8, wherein the first touch electrode layer is in a rhombic grid shape.

12. The manufacturing method as claimed in claim 8, wherein a material used for the first pixel definition layer comprises polyimide.

13. The manufacturing method as claimed in claim 8, wherein the first touch electrode layer is made of a material selected from titanium-aluminum alloy or silver nanowires.

14. The manufacturing method as claimed in claim 8, wherein a thickness of the first touch electrode layer ranges from 0.2 um to 0.4 um.

15. A touch display device, comprising:
   a body, wherein the body comprises a touch display panel as claimed in claim 1.

16. The touch display device as claimed in claim 15, wherein the light emitting layer further comprises a second pixel definition layer and a second touch electrode layer which are arranged in sequence, the second pixel definition layer is disposed on the first touch electrode layer, the second touch electrode layer is disposed on the second pixel definition layer, and the first touch electrode layer and the second touch electrode layer are not in contact with each other to form an embedded touch circuit.

17. The touch display device as claimed in claim 15, wherein the light emitting layer further comprises a third pixel definition layer, and the third pixel definition layer is disposed between the second touch electrode layer and the thin film encapsulation layer.

18. The touch display device as claimed in claim 15, wherein the first touch electrode layer is in a rhombic grid shape.

\* \* \* \* \*